United States Patent
Shinde

(10) Patent No.: US 7,710,159 B2
(45) Date of Patent: May 4, 2010

(54) MULLER-C ELEMENT

(75) Inventor: Suhas V. Shinde, Satara (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/306,641

(22) PCT Filed: Jun. 19, 2007

(86) PCT No.: PCT/IB2007/052349

§ 371 (c)(1),
(2), (4) Date: Dec. 24, 2008

(87) PCT Pub. No.: WO2008/001270

PCT Pub. Date: Jan. 3, 2008

(65) Prior Publication Data

US 2009/0273370 A1    Nov. 5, 2009

(30) Foreign Application Priority Data

Jun. 28, 2006    (EP) .................................. 06116226

(51) Int. Cl.
*H03K 19/20* (2006.01)
(52) U.S. Cl. .......................... 326/115; 326/86; 326/127
(58) Field of Classification Search .................... 326/86, 326/115, 126–127
See application file for complete search history.

(56) References Cited

U.S. PATENT DOCUMENTS 6,028,454 A    2/2000    Elmasry et al.
6,281,707 B1    8/2001    Fairbanks
7,288,971 B1*    10/2007    Plasterer et al. ............. 326/127
2007/0018694 A1*    1/2007    Chen et al. ................... 326/115

OTHER PUBLICATIONS

Mohanavelu R; Heydari P."A Novel Ultra High-Speed Flip-Flop-Based Frequency Divider" 2004 IEEE International Symposium on Circuits and Systems-May 23-26, 2004-Vancouver, BC, Canada PUB-2004 IEEE International Symposium on Circuits and Systems (IEEE Cat. No. 04CH37512)-2004-IEEE-Piscataway, NJ, USA.
Sutherland, I.E., Lexau, J.K.. "Designing Fast Asynchronous Circuits." Proceedings Seventh International Symposium on Asynchronous Circuits and Systems. ASYNC 2001-Mar. 11-14, 2001-Salt Lake City, UT, USA PUB-Proceedings Seventh International Symposium on Asynchronous Circuits and Systems. ASYNC 2001-2001-IEEE Comput. Soc-Los Alamitos, CA, USA IRN-ISBN 0-7695-1034-5.
Anis, Mohab H. and Elmasry, Mohamed I. Self-Timed MOS Current Mode Logic for Digital Applications. Proc. IEEE Interpunct Conf. ASIC/SOC 2002.

* cited by examiner

*Primary Examiner*—Anh Q Tran

(57) ABSTRACT

The invention relates to an electronic device that includes an MCML Muller-c element. The MCML Muller-c element has a first differential stage for operating in a trans-conductance state converting the differential input to a differential output current implementing the logical behavior of the MCML Muller-c element and a second stage operating as a trans-impedance stage being coupled to the first stage. Further, the MCML Muller-c element has peaking circuitry being coupled to the first stage, such that the peaking circuitry and the first stage provide a negative capacitance to the MCML Muller-c element for reducing the damping factor of the MCML Muller-c element.

6 Claims, 6 Drawing Sheets

MULLER-C ELEMENT

Figure 1A:
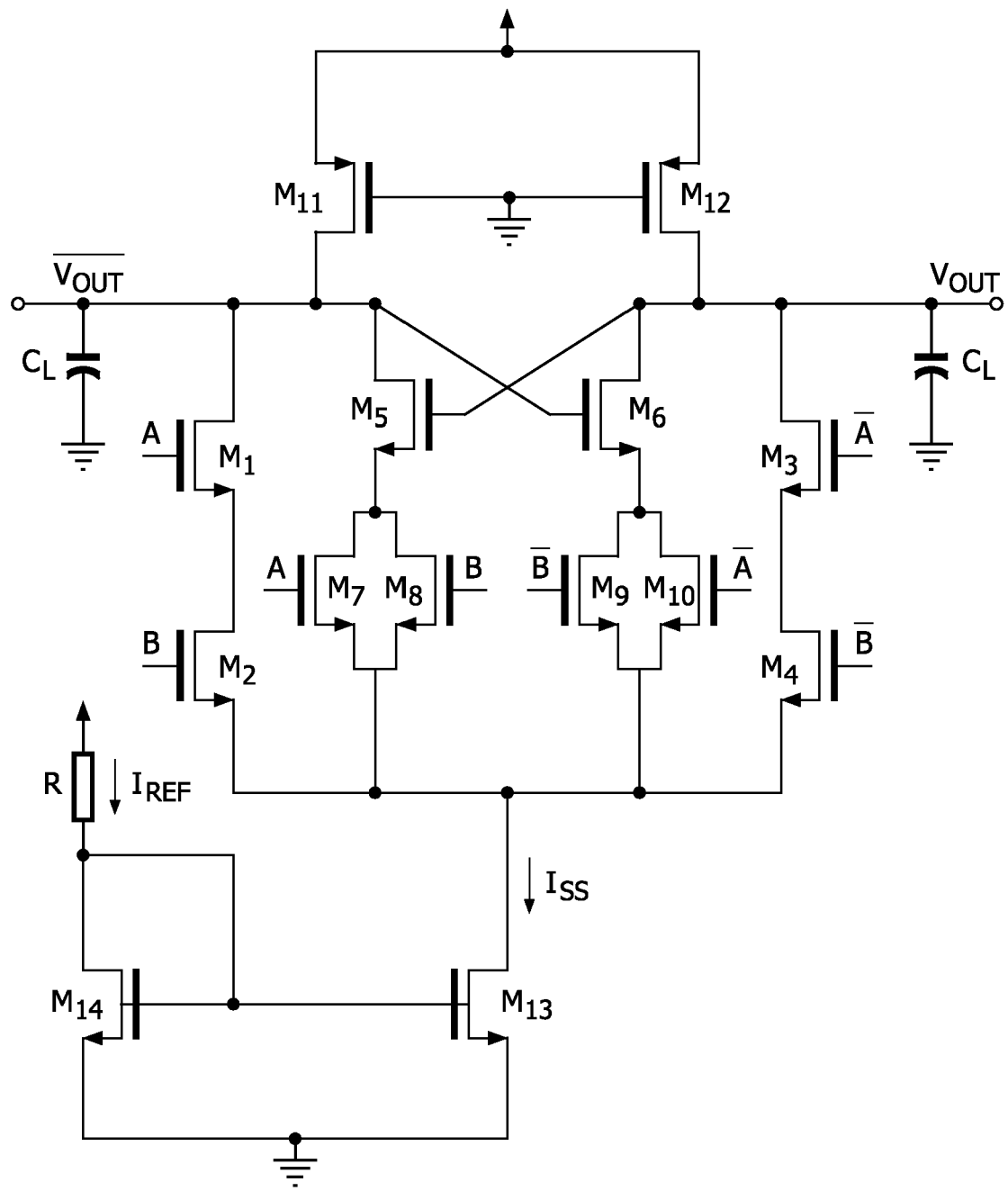

MOS Current Mode Logic (MCML) is conceived for high-speed applications. The MCML topology is primarily employed in CMOS transceivers for applications in broadband communication circuits, such a sonnet described by M. H. Aniss and M. I. Elmasry, in "Self-timed MOS current mode logic for digital applications" in Proc. IEE Interpunct Conf. ASIC/SOC in 2002, pp. 193-197. MCML was first introduced to implement a gigahertz MOS adaptive pipeline techniques. The advantages of MCML circuits are low voltage swing, higher operating frequencies, and less electromagnetic coupling. Single ended static circuits suffer electromagnetic coupling. This aspect becomes even more relevant when chips shrink down to nano-scaled dimensions. Accordingly, CML provides differential (symmetric) signaling making the circuits less susceptible to electromagnetic interference (EMI).

Muller-c elements are named according to their inventor David E. Muller. They pertain to the family of event driven modules. The Muller-c elements (or Muller-c gates) change their outputs only, when all inputs have experienced transitions, i.e. the input levels have changed with respect to those levels having evoked the former output state of the Muller-c gate element. The Muller-c elements are extensively used for design control logic for asynchronous circuits as they are suitable to ensure correct operation of bundled data protocols. Petri nets and signal transfer graphs (STG) are typically used for designing asynchronous circuits in this technical fields as these design techniques exclusively use signal transitions or events.

Prior art two input MCML Muller-c elements are based on differential (symmetric) signal processing. They include NMOS, and PMOS differential networks implementing the logic functionality of the Muller-c gate. Important design parameters are the speed and the power consumption. As generally known in the art, capacitive loads (typically parasitic capacitances) of transistors, wires etc. used in MCML Muller-c elements cause delays, as they have to be charged and discharged, when the device is operated. Given a specific capacitive load, high speed of the electronic gate can only be maintained, if specific design parameters are adapted, such as bias currents etc. An important design parameter relating to the speed of an MCML Muller-c element is the slope signal ratio (SSR). The SSR is the ratio of the rise/fall time to the propagation delay of the device, which should be kept as small as possible. Generally, increasing the speed of an MCML Muller c-element requires increasing either the currents through the device (i.e. the power consumption), or the small signal gain, or both. The small signal gain is usually increased by providing MOS devices having an increased aspect ratio, i.e. a greater gate width to gate length ratio of the input transistors. However, larger transistors provide increased parasitic capacitances which in turn impairs the SSR. Further, many applications use cascades of multiple MCML Muller-c elements. Cascading of MCML Muller-c elements typically requires up-sizing each stage in order to maintain equal delays for optimum speed performance entailing a higher power consumption etc. Therefore, a technique is known to improve the speed without further increasing the device dimensions. This technique is known as inductive peaking.

Inductive peaking was proposed to improve transient performance of MCML gates. There are two ways of implementing inductive peaking. One is series peaking, where inductors are arranged in series with internal resistive loads in a transimpedance stage of the gate, and the other is shunt peaking where inductors are placed in shunt with load capacitors. The inductors serve to turn the MCML Muller-c gates into second order systems, allowing to adjust the damping of the system by properly choosing the inductors. A drawback of this known architecture is that the inductors usually amount to values of about 10 nH to 100 nH which results in a significant increase in area for integrated circuits. If the inductors are provided externally to an integrated circuit, the complexity of the circuit increases and the reliability decreases. Accordingly, this approach is disadvantageous for high density digital designs.

It is an object of the present invention to provide a MCML Muller-c element that provides a good high speed performance.

The object is solved by an electronic device according to claim 1. Accordingly, the present invention provides an electronic device including an MCML Muller-c element. The MCML Muller-c element has a first stage for operating in a transconductance state converting an input to an output current substantially implementing the logical behavior of the MCML Muller-c element, and a second stage operating as a transimpedance stage being coupled to the first stage. Further, an inductorless peaking circuitry is coupled to the first stage. The inductorless peaking circuitry and the first stage implement a negative capacitance for the MCML Muller-c element reducing the damping factor of the MCML Muller-c element.

Accordingly, an electronic device with improved properties is provided. The inductorless peaking circuitry and the first stage interact such that they reduce the damping of the MCML Muller-c element. The inductorless peaking circuitry is coupled to the first stage such that the first stage or some transistors of the first stage provide a negative resistance, e.g. to the output node of the device. The inductorless peaking circuitry properly coupled to the first stage appears as a negative capacitance at a node of the device. The so formed negative capacitance can compensate a certain amount of the capacitive loads, usually due to parasitic capacitances. Reduction of the damping of the MCML Muller-c gate entails a better performance of the device, e.g. higher speed. Therefore, upsizing of the input devices is not necessary to maintain good performance. Further, there is no need for area consuming inductors for a reduced damping factor, as the negative capacitance is implemented by coupling the inductorless peaking circuitry to the input stage. As the configuration according to the present invention reduces the load capacitance, conventional upsizing of transistors is avoided. Accordingly, a negative capacitance is implemented in a MCML Muller-C element according to the present invention by making use of already existing devices (transistors) having a negative resistance just by adding peaking circuitry.

According to an aspect of the invention, the electronic device or the MCML Muller-c element is designed as differential circuitry. This is helpful to suppress noise and to provide a better signal to noise ratio.

According to another aspect of the invention the inductorless peaking circuitry includes a peaking capacitance. Capacitances are advantageous for integrated circuits, as implementing integrated capacitances is easier and less area consuming than implementing integrated inductors. The peaking capacitance in the inductorless peaking circuit is preferably arranged to be in series with a negative impedance provided by the first stage. Accordingly, the input stage, or a part of the input stage and the peaking capacitance exhibit a specific negative capacitance to certain node of the device, thereby reducing the positive (load) capacitance at the respective node.

According to another aspect of the invention the inductorless peaking circuitry of the MCML Muller-c element includes further a current source for providing additional biasing current for the first stage. If additional circuitry is coupled to the first stage, a new biasing for the input stage might be necessary. Further, the input stage provides to functions according to the invention: one is the logic function of the MCML Muller-c element, the other is the negative resistance used to establish a negative capacitance. Accordingly, the proper biasing for both function must be assured, which might require an additional biasing, that should not impair the respective other function. Usually, the biasing current of the additional current mirrors is smaller than the biasing current for the input stage.

According to an aspect of the invention, the capacitive value of the peaking capacitance is between 5 fF and 50 fF. These values are small enough to be implemented in integrated circuits without substantial increase chip area.

According to an aspect of the invention a data processing system is provided including an electronic device with an MCML Muller-c element having an inductorless peaking circuitry according to the invention. The present invention is beneficial for a wide variety of applications being typically used in data processing systems.

Still another aspect of the invention relates to a method for designing an electronic device that includes an MCML Muller-c element. The method includes a first step of providing a first stage for operating in a transconductance state converting an input to an output implementing the logical behavior of the MCML Muller-c element, a second step of providing a second stage, which operates as a transimpedance stage being coupled to the first stage, and a third step of providing an inductorless peaking circuitry being coupled to the first stage, the inductorless peaking circuitry and the first stage providing together a negative capacitance for reducing the damping factor of the MCML Muller-c element.

Generally, the architecture according to the present invention increases the speed of an MCML Muller-c element without affecting the input capacitor experienced by another device being coupled to the MCML Muller-c element. To this end, active elements of the MCML Muller-c gate are selected to be used together with additional circuitry, which is for example a capacitor, to implement a negative capacitance on a specific node of the gate. This is particularly advantageous in a chain, or a cascade of multiple MCML Muller-c elements. Accordingly, the architecture is more speed and area efficient than prior art solutions.

According to the present invention the signal slope ratio (SSR) can be improved, i.e. the SSR can be kept small by a specific peaking technique. A small SSR ensures a small total propagation delay and proper shape of the waveform, i.e. a good signal integrity in cascade MCML circuits like an asynchronous pipeline. MCML Muller-C gate speed increases with peaking technique applied. The speed of MCML cascade chain increases due to reduced load capacitance on every stage.

Figure 2:
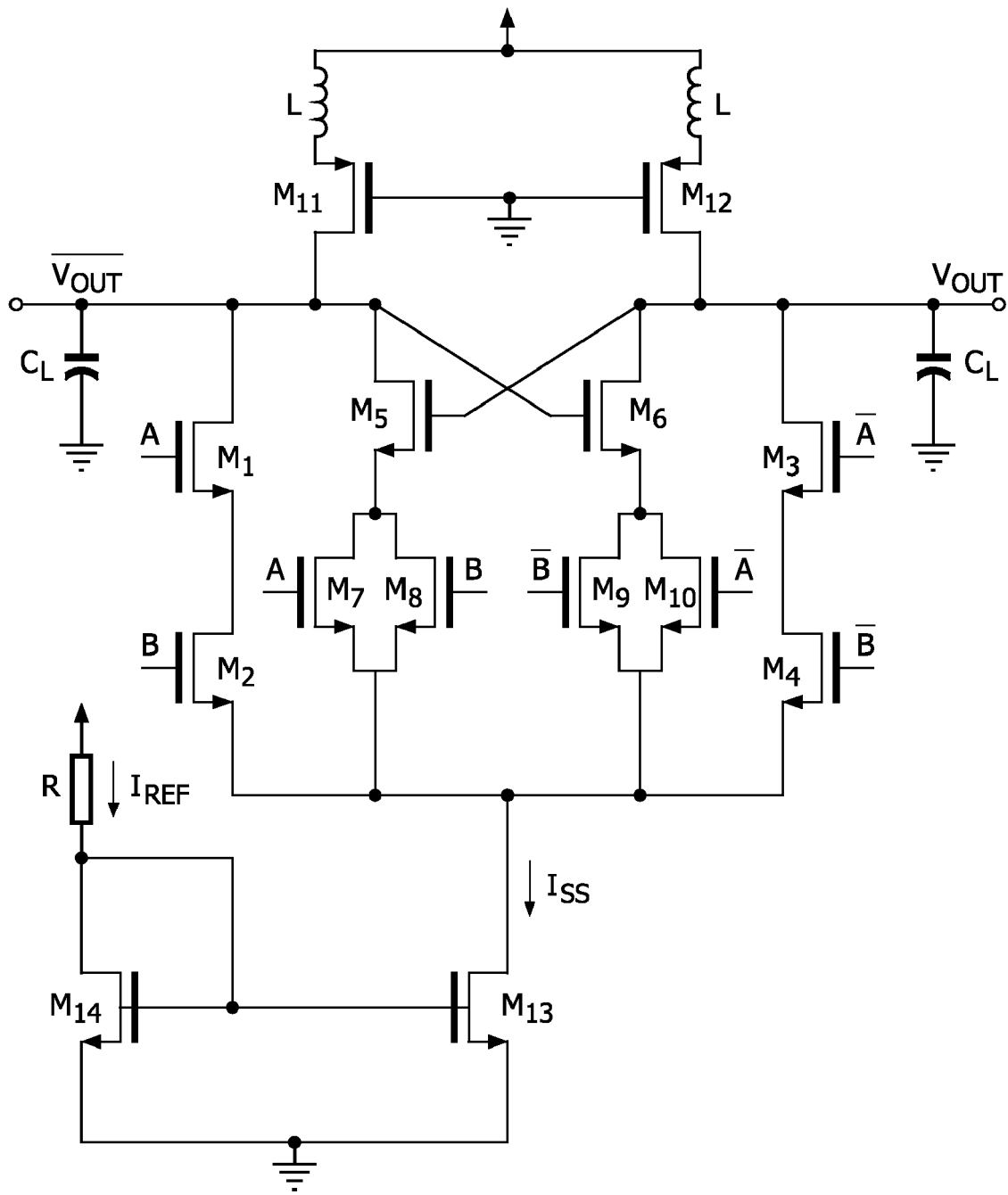
Figure 3:
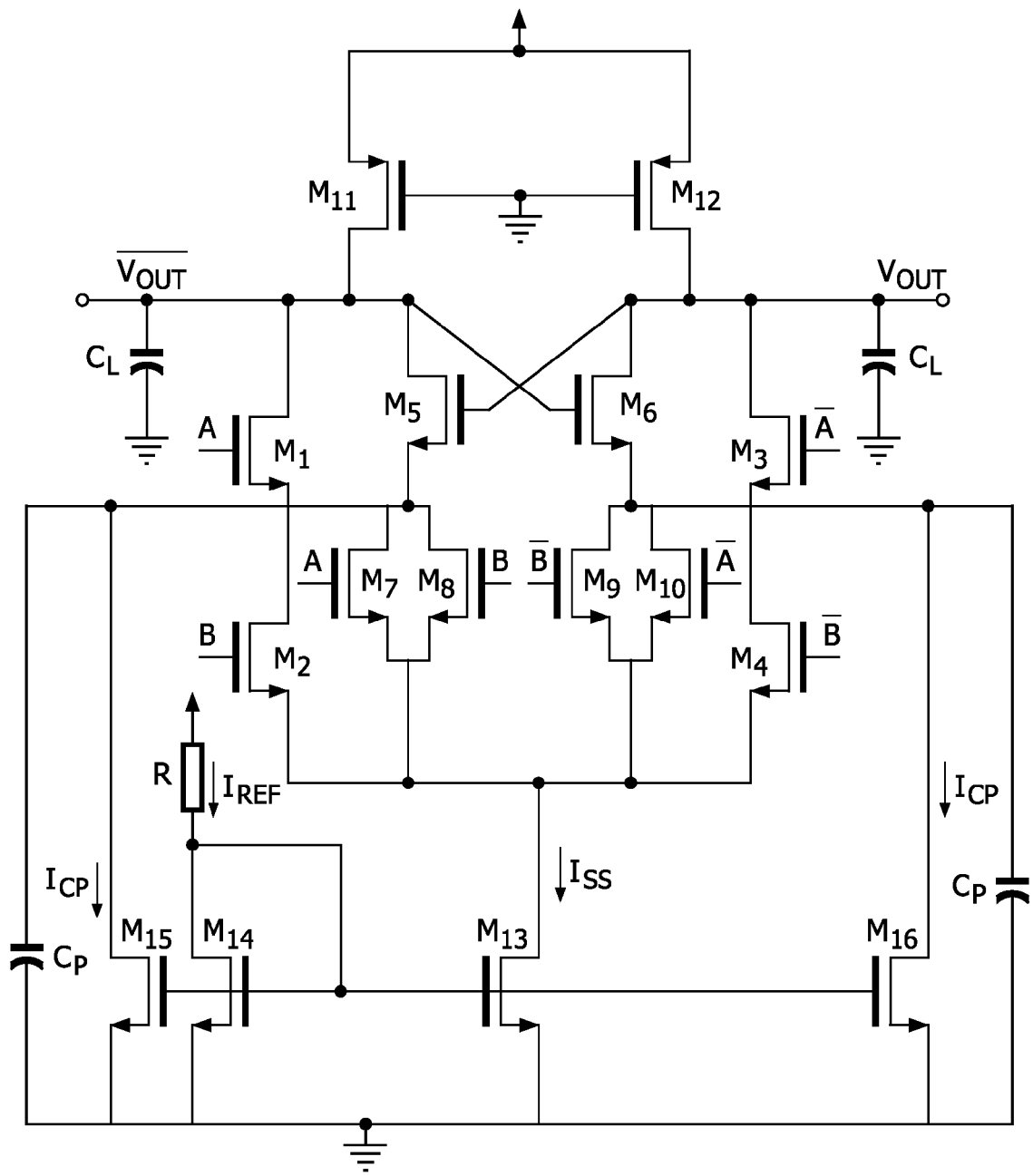
Figure 4:
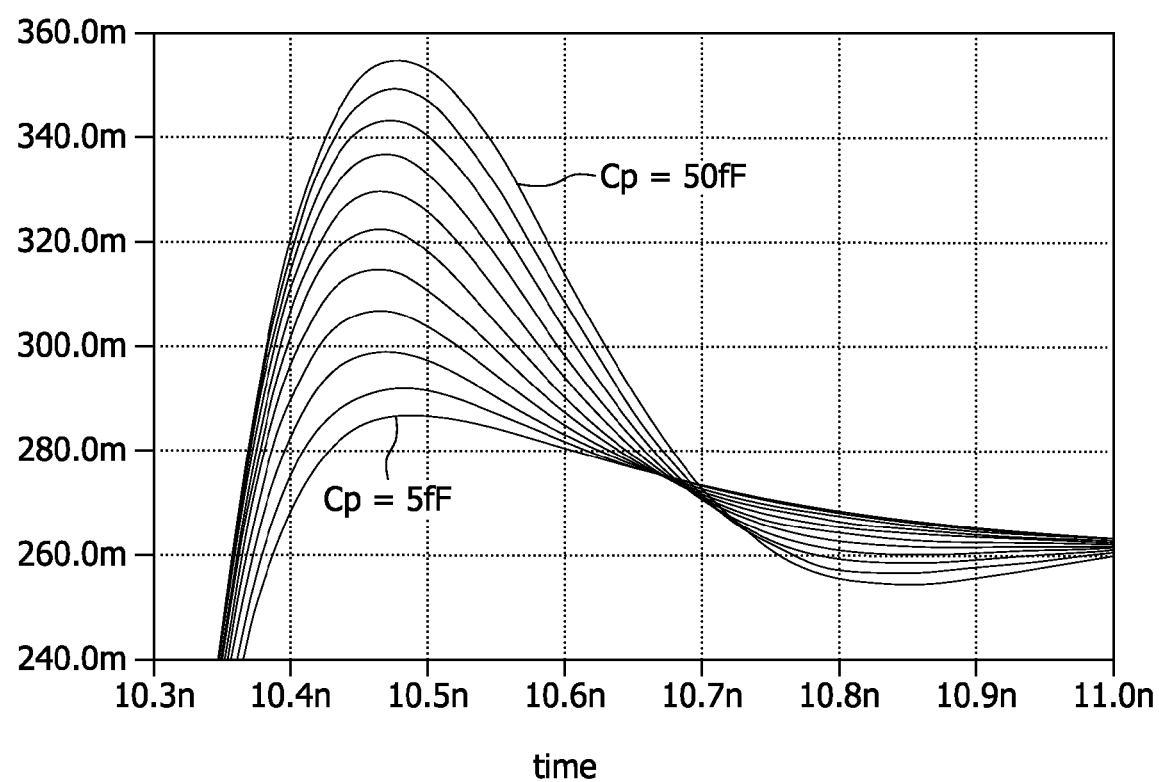
Figure 5A:
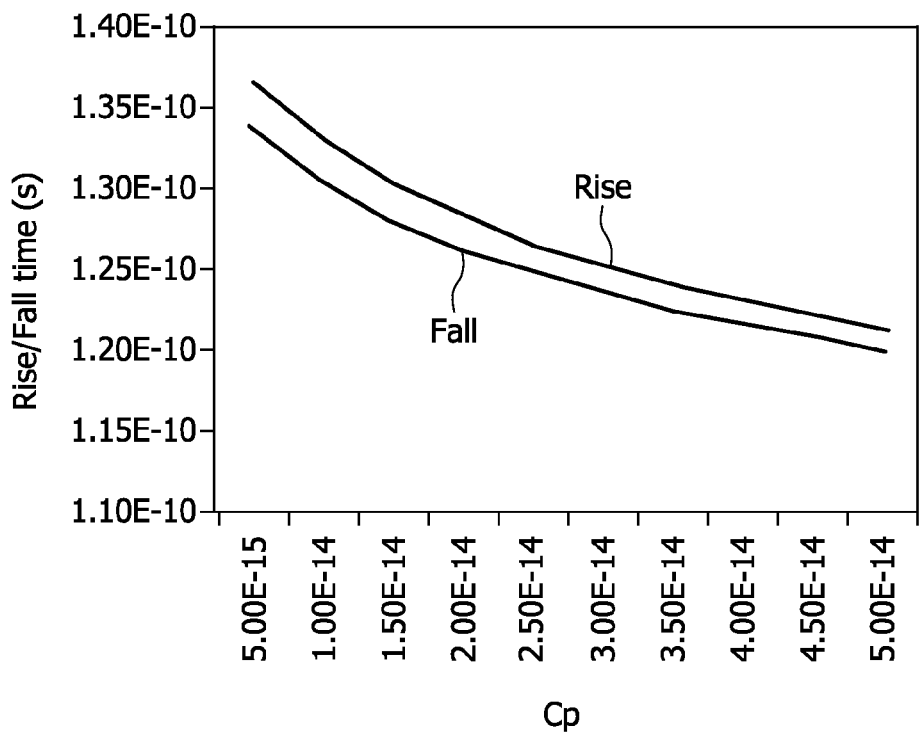

These and other aspects of the invention are apparent from and will be elucidated with reference to the embodiments described hereinafter and with respect to the following Figures:

FIGS. 1(a) and (b) show a prior art two input MCML Muller-c element,

FIG. 2 shows a prior art two input MCML Muller-c element according to inductive peaking, FIG. 3 shows a preferred embodiment according to the present invention, FIG. 4 shows simulation results for the MCML Muller-c element according to the invention for different values of the peaking capacitor, FIGS. 5(a) and (b) show the different rise and fall times for different values of the peaking capacitance for an MCML Muller-c element according to the invention.

A prior art two input MCML Muller-c element is shown in FIG. 1. The whole design is based on differential (symmetric) signal processing. It includes an NMOS differential network implementing the logic functionality of the Muller-c gate. The basic functionality is that of a current steering switch. The MCML Muller-c element includes two stages. The first differential stage operates as a transconductance to convert differential input signals to an equivalent differential output current. The first stage mainly includes NMOS transistors M1 to M10. There is further a current mirror consisting of NMOS transistors M13 and M14 to provide a current sink for a current Iss from the differential input stage that is biased by use of a reference current $I_{REF}$. Further, there is a second differential stage consisting of PMOS transistors M11 and M12. M11, M12 are the PMOS load transistors operating in the triode region. This second stage acts as transimpedance to allow conversion of current differences into voltage differences. When input signals are applied to input terminals (gates of transistors M1 to M4, and M7 to M10) A, $\overline{A}$ and B, $\overline{B}$ a differential output signal is produced on output terminals $V_{out}$, $\overline{V_{out}}$ according to the logic function of the device. The load capacitances $C_L$ coupled to output terminals $V_{out}$, $\overline{V_{out}}$ represent the capacitances of devices coupled to the output nodes.

Figure 1B:
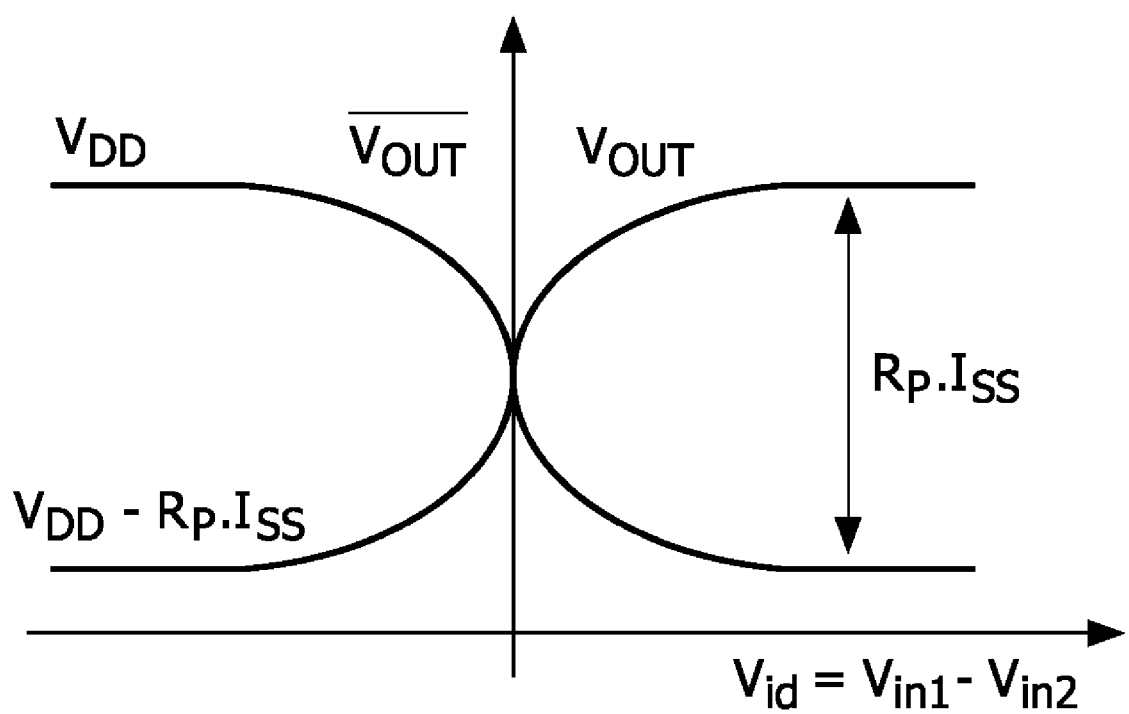

FIG. 1(b) shows the transfer characteristic of the MCML Muller-c element of FIG. 1(a). If the differential input of the Muller-c element varies from $-\infty$ to $+\infty$, i.e. from a maximum negative input voltage a maximum positive input voltage, the output nodes of the gates $V_{out}$, $\overline{V_{out}}$ change from VDD-Rp*Iss to VDD. VDD is the positive supply voltage and Rp is the corresponding load resistance of the PMOS stage load transistors M11, M12. Accordingly, FIG. 1(b) shows the maximum output voltage swing. The output swing and several other design considerations are of major interest for designing a MCML Muller-c element according to FIG. 1(a). Important design parameters are for example the size of the tale current Iss, the small signal gain of the input stage and the slope signal ratio (SSR). The mentioned design considerations influence speed and power dissipation of the MCML Muller-c element. Generally, increasing the speed of an MCML Muller c-element requires increasing either Iss, or the small signal gain, or both. The small signal gain is usually increased by providing MOS devices having an increased aspect ratio, i.e. a greater gate width to gate length ratio of the input transistors. However, larger transistors provide increased parasitic capacitances. On the other hand, the SSR is the ratio of the rise/fall time to the propagation delay of the device, which should be kept as small as possible. However, the SSR can degrade when the rise/fall times increase as a consequence of larger MOS transistors.

Many applications use cascades of multiple MCML Muller-c elements. Cascading of MCML Muller-c elements typically requires up-sizing each stage in order to maintain equal delays for optimum speed performance. Increasing the device sizes impairs speed and power dissipation, since load capacitances and input capacitances increase as well. Therefore, another technique is known to improve the speed without further increasing the device dimensions. This technique is known as inductive peaking.

FIG. 2 shows another prior art MCML Muller-c element with inductive peaking. Inductive peaking was proposed to improve transient performance of MCML gates. There are two ways of implementing inductive peaking. One is series peaking, where inductors are arranged in series with load resistances as shown in FIG. 2, and the other is shunt peaking where inductors are placed in shunt with load capacitors. FIG. 2 shows basically the same configuration as depicted in FIG. 1. However, in FIG. 2 two additional inductors L are introduced in the PMOS load stage. By use of inductors, the system is modified into a second order system, enabling a reduction of the damping factor due to the load capacitances $C_L$, the drain to bulk capacitances of transistors M1, M3, M5, M6, M11, and M12, and the gate to source capacitances of M5 and M6. A drawback of this architecture is that the inductors require about 10 nH to 100 nH which results in a significant increase in area for integrated circuits. Accordingly, this approach is disadvantageous for high density digital designs.

FIG. 3 shows a preferred embodiment according to the present invention. The proposed architecture of an MCML Muller-c element uses an inductorless peaking technique. Instead of applying inductors to the load stage, two additional current sources are implemented by transistors M15 and M16. Additionally, a peaking capacitance Cp shunts the two current sources, respectively. The current sources serve to bias the cross coupled NMOS transistors M5, M6. Accordingly, the NMOS transistors M5, M6 have two purposes: one being the logic functionality of the Muller-c element, and the other being inductorless peaking. The small signal AC analysis of the cross coupled NMOS transistors M5, M6 having transconductances of $g_{m5/6}$, and the shunting capacitors Cp reveals that the devices provide a negative resistance $-2/g_{m5/6}$ in series with a negative capacitance $-C_p/2$. A further analysis of this circuit shows that there is a second order system with a natural frequency of oscillation $\omega_n$ of $$\omega_n = \frac{1}{\sqrt{R_P \cdot C_{OUT} C_p / gm5/6}}$$

and a damping ratio $\xi$ of $$\xi = \frac{R_P(C_{OUT} - C_p) + \frac{C_p}{g_{m5/6}}}{2\sqrt{R_P C_{OUT} \cdot C_p / gm5/6}}$$

wherein Rp is the resistance of the PMOS load transistors, Cp is the peaking capacitor, $g_{m5/6}$ is the transconductance of transistors M5, M6. Cout is the overall load capacitance of the MCML Muller-c element, given by the following expression $$C_{OUT} = C_L + C_{dbM1/3} + C_{dbM5/6} + C_{dbM11/12} + C_{gsM5/6}$$

wherein $C_{dbM1/3}$, $C_{dbM5/6}$, $C_{dbM11/12}$ are the drain to bulk capacitances of transistors M1, M3, M5, M6, M11, and M12, and, $C_{gsM5/6}$ is the gate to source capacitances of M5 and M6.

As set out above, a cascaded chain of Muller-c elements in asynchronous control logic requires a scaling of devices by an optimum stage ratio. The scaling affects load capacitors and input capacitors, thereby impairing speed and power consumption. The architecture according to the present invention allows increasing the load capacitor without any effect on the input capacitor. Accordingly, inductorless peaking circuits according to the present invention provides a speed and area efficient design.

According to this embodiment of the present invention the cross coupled transistors M5, M6 and the peaking capacitors implement a negative capacitance. Accordingly, the already present transistors M5 and M6 devices are used as a negative resistance forming a total negative capacitance by adding the two peaking capacitances Cp.

In order to keep M5 and M6 devices in an appropriate state ("ON"-state), they must be biased. Biasing is realized by providing two additional current sinks implemented by devices M15 and M16 as shown in FIG. 3. The current $I_{REF}$ through M14 is mirrored to M15. As a rule of thumb, the sizes of M15 and M16 can be approximately one quarter of the size of M13. Transistor M13 forms a major current sink to satisfy the logic functionality of the gate. Accordingly, the current Iss through transistor M13 is usually substantially larger than the current Icp through M15, M16. A rough dimensioning criteria might be $I_{ss}/I_{cp} = W(M13)/W(M15/16)$ is approximately 4. W(M13) and W(M15/16) are the respective channel widths of the devices M13, M15 and M16, while the channel lengths of transistors M13, M15, and M16 are considered to be equal.

FIG. 4 shows simulation results for the MCML Muller-c element according to the invention for different values of the peaking capacitor Cp. Accordingly, higher values of Cp (e.g. 50 fF) entail an higher overshoot, indicating a higher speed and a reduction of the damping. Lower values of Cp (e.g. 5 fF) relate to higher damping. So, the performance improvement is at the expense of peak overshoot.

Figure 5B:
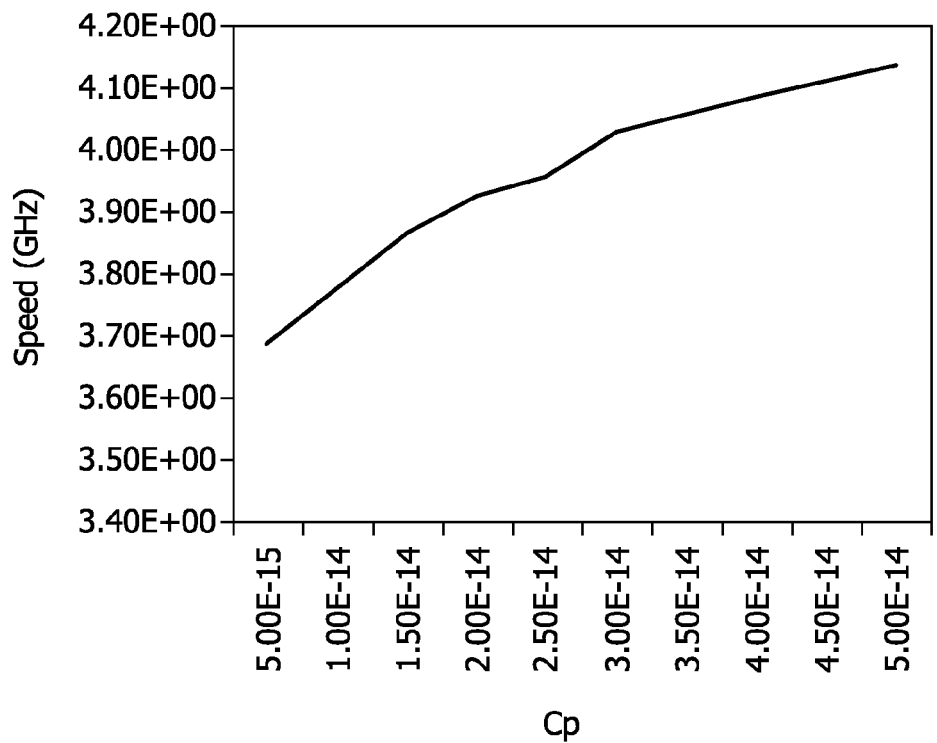

FIG. 5 shows other simulation results for an MCML Muller-c element according to the invention for different values of the peaking capacitor Cp. As shown in FIG. 5(a), the rise and fall time decreases with increasing peaking capacitors. A rise time improvement of 11.7% and fall time improvement of 10.4% is observed for a 50 fF peaking capacitor. Similarly, speed increases with increasing peaking capacitor values. The speed increase is 17.8% with peak overshoot of 23.8% for a peaking capacitor value of 50 fF as shown in FIG. 5(b).

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere effect that certain measures are resided in mutually different dependent claims does not indicate that a combination of these measures cannot be used as advantage.

Furthermore, any reference signs in the claims shall not be considered as limiting the scope of the claims.

The invention claimed is:

1. Electronic Device comprising a MOS Current Mode Logic (MCML) Muller-c element, the MCML Muller-c element comprising:

a first stage for operating in a transconductance state converting an input to an output implementing the logical behavior of the MCML Muller-c element, a second stage operating as a transimpedance stage being coupled to the first stage, and inductorless peaking circuitry being coupled to the first stage, the inductorless peaking circuitry and the first stage providing together a negative capacitance for reducing the damping factor of the MCML Muller-c element.

2. Electronic device according to claims 1, wherein the inductorless peaking circuitry comprises a peaking capacitance (Cp).

3. Electronic device according to claim 2, wherein the inductorless peaking circuitry comprises further a current source for providing additional biasing current (Icp) for the first stage.

4. Electronic device according to claims 2, wherein the capacitive value of the peaking capacitance (Cp) is between 5 fF and 50 fF.

5. Data processing system comprising an electronic device according to claim 1.

6. Method for designing an electronic device comprising an MOS Current Mode Logic (MCML) Muller-c element, the method comprising:
  providing a first stage for operating in a transconductance state converting an input to an output implementing the logical behavior of the MCML Muller-c element,
  providing a second stage operating as a transimpedance stage being coupled to the first stage, and
  providing an inductorless peaking circuitry being coupled to the first stage, the inductorless peaking circuitry and the first stage providing together a negative capacitance for reducing the damping factor of the MCML Muller-c element.

* * * * *